United States Patent
Tang et al.

(10) Patent No.: US 7,575,007 B2
(45) Date of Patent: Aug. 18, 2009

(54) CHAMBER RECOVERY AFTER OPENING BARRIER OVER COPPER

(75) Inventors: Hairong Tang, Sunnyvale, CA (US); Xiaoye Zhao, Mountain View, CA (US); Keiji Horioka, Tokyo (JP); Jeremiah T. P. Pender, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 44 days.

(21) Appl. No.: 11/508,345

(22) Filed: Aug. 23, 2006

(65) Prior Publication Data

US 2008/0050922 A1  Feb. 28, 2008

(51) Int. Cl.
*C25F 1/00* (2006.01)
*C25F 3/30* (2006.01)
*C25F 5/00* (2006.01)

(52) U.S. Cl. .................... 134/1.1; 134/1.2; 134/1.3

(58) Field of Classification Search ............ None
See application file for complete search history.

(56) References Cited

U.S. PATENT DOCUMENTS

| | | | |
|---|---|---|---|
| 5,356,478 A * | 10/1994 | Chen et al. ............ | 134/1 |
| 6,258,728 B1 * | 7/2001 | Donohoe et al. ......... | 438/725 |
| 6,277,759 B1 * | 8/2001 | Blalock et al. .......... | 438/706 |
| 6,569,257 B1 * | 5/2003 | Nguyen et al. .......... | 134/26 |
| 7,097,716 B2 * | 8/2006 | Barnes et al. ........... | 134/26 |
| 2004/0074869 A1 * | 4/2004 | Wang et al. ............ | 216/63 |
| 2007/0107749 A1 * | 5/2007 | Sin ..................... | 134/1.1 |

\* cited by examiner

*Primary Examiner*—Duy-Vu N Deo
(74) *Attorney, Agent, or Firm*—Patterson & Sheridan, LLP

(57) ABSTRACT

A chamber dry cleaning process particularly useful after a dielectric plasma etch process which exposes an underlying copper metallization. After the dielectric etch process, the production wafer is removed from the chamber and a cleaning gas is excited into a plasma to clean the chamber walls and recover the dielectric etching characteristic of the chamber. Preferably, the cleaning gas is reducing such as hydrogen gas with the addition of nitrogen gas. Alternatively, the cleaning gas may an oxidizing gas. If the wafer pedestal is vacant during the cleaning, it is not electrically biased. If a dummy wafer is placed on the pedestal during cleaning, the pedestal is biased. The cleaning process is advantageously performed every wafer cycle.

19 Claims, 4 Drawing Sheets

CHAMBER RECOVERY AFTER OPENING BARRIER OVER COPPER

FIELD OF THE INVENTION

The invention relates generally to plasma etching of materials in the fabrication of integrated circuits. In particular, the invention relates to a chamber plasma cleaning step

BACKGROUND ART

Plasma etching is widely used in the fabrication of silicon integrated circuits. One form, often called dielectric etching, etches holes through dielectric or insulating layers such as silicon oxide to provide vertical electrical connections between different levels of the integrated circuit. One dielectric etch process used for advanced integrated circuits forms an inter-level via or other vertical electrical interconnect in a structure utilizing copper metallization and a low-k dielectric. The wafer enters the dielectric etch process having a structure simply illustrated in the cross-sectional view of FIG. 1. A lower-level dielectric layer 10 has a copper contact 12 formed in its surface. The copper contact 12 is likely to be part of a horizontal interconnect formed in a dual-damascene interconnect. It is understood that the copper contact 12 is principally composed of copper with up to 10 at % of intentional dopants or unintended impurities. The lower dielectric layer 10 and the copper contact 12 are covered by a generally planar barrier layer 14, which protects the underlying dielectric and acts as an etch stop layer for the next dielectric layer. An upper dielectric layer 16 is deposited over the barrier layer 14. In a dual-damascene interconnect structure, the upper dielectric layer 16 may be composed of multiple layers separated by an etch stop layer, but the description here will focus on a simpler via structure. The two dielectric layers 10, 16 may be composed of silica or other silicate glass but more advanced devices use low-k dielectric materials ranging from halogen doped silicon dioxide to porous compositions of silicon, carbon, and oxygen, such as BlackDiamond® dielectric available from Applied Materials of Santa Clara, Calif. The barrier layer 14 for more conventional silica dielectrics has typically been silicon nitride, but tantalum nitride is often used for copper metallization, and low-k dielectrics often need the use of more advanced barrier materials, such as SiON or SiC.

A layer of photoresist is deposited over the upper dielectric layer and photographically patterned to form a photomask 18 having an aperture 20 over the area of the intended hole to be etched in the upper dielectric layer 16. At this stage, the wafer is ready for dielectric etching using the photomask 18 to define the etching. The photomask 18 may be a more complex than illustrated, for example, formed of a tri-layer of which only thin upper photoresist layer is photographically patterned to expose an intermediate oxide layer overlying a thicker lower resist layer. The dielectric etch procedure is used to etch the oxide layer, which acts as a hard mask for the thicker lower resist layer. Alternatively, a hard mask layer of, for example, titanium nitride or other material may be intermediate the upper dielectric layer 16 and the photomask 18 and its etching is defined by the photomask 18. Thereafter, the hard mask patterns the etching of the typically softer dielectric materials.

In the dielectric etch process, a plasma etch reactor is used to generate a plasma which, as illustrated in the cross-sectional view of FIG. 2, etches the upper dielectric layer 16 through the photomask 18 to form a via hole 24 extending through the dielectric layer 16 and, at this stage, stopping on the barrier layer 14. For silica-based dielectrics, the etching gas is typically based on a fluorocarbon gas such as $C_4F_6$ although often other gases are added. Under the proper conditions, the fluorocarbon plasma etches oxide preferentially to silicon and silicon-based non-oxide materials such as silicon nitride and silicon carbide. Hence, the principal dielectric etch stops on the barrier layer 14.

In a barrier breakthrough etch, as illustrated in the cross-sectional view of FIG. 3, the etching chemistry is changed such that the relatively thin barrier layer 14 is etched away at the bottom of the via hole 24 to expose the copper contact 12. Finally, the remnant photoresist is removed in an ashing step, typically using an oxygen-plasma, so that the upper dielectric layer 16 is exposed for the next processing step. However, there may be a protective layer formed over the upper dielectric layer 16 prior to the dielectric etch to provide extra protection. Thereafter, metallization processing commences including forming a conformal barrier diffusion layer and a copper seed layer, often done by sputtering. Electrochemical plating (ECP) is typically used to fill and overfill the via hole 24 and the chemical mechanical polishing (CMP) removes the copper outside the via hole 24. These latter steps are outside the focus of the invention and will not be further discussed in detail.

In dual-damascene structures, the via hole 24 has a narrow lower portion as illustrated and a wider upper portion or trench. The metallization process simultaneously metallizes both of them to form both the vertical interconnect in the via and a horizontal interconnect or pad in the trench. The dielectric etching of the dual-damascene structure is more complex, but similarly to the described structure it opens the barrier 14 as nearly the last step.

It is greatly desired to perform an integrated dielectric etch process including as many as possible of the described etching steps in a single dielectric etch chamber from the etching of the lower level of the tri-level resist to the ashing. Use of a single chamber reduces the overhead of transferring wafers between multiple dedicated chambers, simplifies the scheduling, and permits the use of fewer expensive etch reactors if the production level is not very high.

An example of a single chamber capable of widely different use is a capacitively coupled plasma etch chamber 30 schematically illustrated in the cross-sectional view of FIG. 4 and described by Hoffman et al. in U.S. Pat. Nos. 6,528,751; 6,853,141; and 6,894,245, collectively Hoffman and all incorporated herein by reference. Hoffman expands upon features of the former in U.S. patent application Ser. No. 11/046,538, filed Jan. 28, 2005. The Enabler chamber available from Applied Materials incorporates parts of the disclosed chamber. The etch chamber 30 separately biases the showerhead and the pedestal supporting the wafer and attempts to decouple the VHF source power applied to the showerhead and producing the plasma from the HF source power applied to the pedestal and producing a DC self bias which affects the energy of an etching ion. The chamber 30 also includes careful selection of source frequency and careful coupling of the VHF power into the chamber, features best described in the cited application. Other features to be briefly described greatly improve the uniformity of etching.

The etch chamber 30 includes a main chamber body 32 including a baffled annular pumping port 34 to a vacuum pump 36 allowing the chamber to be pumped to 100 milliTorr and below. A pedestal electrode 38 supports a wafer 40 be etch processed in opposition to a showerhead 42, which may be made of silicon carbide and which uniformly supplies etching gas into a processing space 44 above the wafer 40. A wafer port 48 with an associated slit valve allows the wafer 38 to be inserted into the chamber 30. An HF power supply 50 RF biases the pedestal electrode 40 through a capacitive matching circuit 52 to produce the DC self bias on the wafer 38. The frequency of the HF power supply 50 may be in the low megahertz range. In some applications not specifically discussed here, two HF power supplies operating respectively at 1.8 MHz and 2.0 MHz may be both input to the matching circuit 52. A broader preferred range for the HF frequency is between 1 and 14 MHz.

The RF biasing of the showerhead 42 is carefully controlled through a coaxial stub 56 including an inner conductor 58 and an outer conductor 60 separated by a insulator 62 and terminated by a short 64 at the end of the stub 56 away from the showerhead 42. The stub 56 has predetermined length, for example, a quarter wavelength of a VHF frequency that provides both high coupling and a wide output impedance. A VHF power supply 68, for example, operating at 162 MHz, is connected through a coaxial cable 70 to the inner conductor 58 at a distance from the short 64 which provides high power coupling. At the showerhead end of the stub 56, the outer conductor 60 is grounded to the chamber body 32 and the inner conductor 58 is connected to a flared conductor 74 which is capacitively coupled to the showerhead 42 through an insulating ring 76 of carefully controlled thickness, which effectively capacitively coupled VHF power onto the showerhead 42 but isolates the VHF biasing of the showerhead 42 from the DC self-biasing of the pedestal electrode 38. A broader preferred range for the VHF is between 150 and 325 MHz.

The showerhead 42 contains a large number of apertures 78 to evenly supply processing gas into the processing space 44. However, the apertures are divided into an annular outer zone 80 and an annular inner zone 82 connected via respective foam-filled manifolds 84, 86 and gas supply lines 88, 90 through a bore 92 within the stub 56 to inner and outer gas supplies 94, 96. Thereby, the process gas may be differentially supplied to inner and outer portions of the wafer 40. A typical diameter of the inner zone 82 is 8.1 inches (206 mm) for a 300 mm wafer. Heating or cooling fluid is supplied to the back of the showerhead 42 and returned therefrom through fluid lines 104 passing through the stub bore 92 and connected to a thermal fluid source 106.

The dual zone showerhead provides a means for tuning the radial distribution of all species of the process gas including neutral atoms or molecules. The ionized species can be separately tuned by two coaxial coils 112, 114 placed in back of the showerhead 42 and supplied with separately controllable amounts of DC current by a plasma steering controller 116 to produce magnetic fields in the processing space 44. The first coil 112 is placed in a radially outer position outside of the showerhead 42 and a short distance above a level of the showerhead 42. The second coil 114 is placed in a radially inner position and a longer distance above the showerhead, preferably adjacent the outside of the top of the flared conductor 72. When approximately equal currents of the same polarity pass through the two coils 112, 114, a cusp-shaped magnetic field is produced having significant radial components in the processing space 44 between the showerhead 42 and the wafer 40, which can steer the ionized components of the process gas.

However, even in the advanced capacitively coupled etch reactor 30, the barrier open step has been found to cause difficulties in the remainder of the integrated dielectric etch process performed in the same chamber. For any production process, the process must remain steady during prolonged operation and not necessitate excessive downtime for chamber cleaning and the like.

Dry cleaning of a chamber with a plasma or an active gas is well known in other contexts. Chambers used for plasma-enhanced chemical vapor deposition (CVD) are nearly as likely to be coated with the CVD material as is the wafer and hence require periodic cleaning. However, cleaning CVD chambers is simple in two respects. The deposited material is well characterized since it is the material being coated on the wafer and hence the cleaning chemistry can be closely tailored to the material being cleaned. Also the chamber coating tends to be deposited nearly uniformly over the interior surface of the chamber. On the other hand, cleaning plasma etch chambers tends to be more difficult. Etching byproducts of somewhat indeterminate composition are likely to deposit on the chamber walls, particularly near the vacuum pumping ports. Since most etching chemistry is based on halogen-containing gases, the chamber walls tend to be coated with metal halides as well as other material. Etching is typically performed through a patterned photomask of carbonaceous composition. The remnants of the photoresist are typically removed in an oxygen-based plasma ashing step. Although in the past the ashing was performed in a separate ashing reactor, the modern trend is to ash within the etching reactor. Further, the byproducts of the main etch often react with the partially etching photoresist and condense on the chamber walls as a polymeric layer. It is known to periodically clean the chamber with a halogen-based cleaning step and fluorine is particularly useful, for example, in a $SiF_4$ cleaning step.

Lu et al. in U.S. Pat. No. 6,352,081 describe cleaning a chamber used for etching copper by a two-step process of an oxidizing etch followed by a fluorocarbon etch.

The cleaning of a plasma etch chamber used to open a dielectric layer over copper or other metal presents distinctive problems since both the dielectric byproducts and the copper byproducts need to be removed and present substantially different chemistries.

SUMMARY OF THE INVENTION

The invention includes a chamber dry cleaning process to recover dielectric etching characteristics, which are particularly evident when opening a dielectric layer over a metal layer, such as a copper metallization. In one aspect of the invention, the chamber is cleaned after every wafer cycle of dielectric etching, either with no wafer in the etch chamber or with a dummy wafer protecting the wafer support pedestal.

The cleaning gas, which is excited into a plasma, is preferably reducing, for example containing hydrogen gas preferably with the addition of nitrogen gas. Alternatively, the cleaning gas may be oxidizing or be a fluorocarbon. It is especially advantageous to follow the reducing clean with an oxidizing step, which also ashes photoresist residues.

DETAILED DESCRIPTION OF THE PREFERRED EMBODIMENTS

Figure 3:
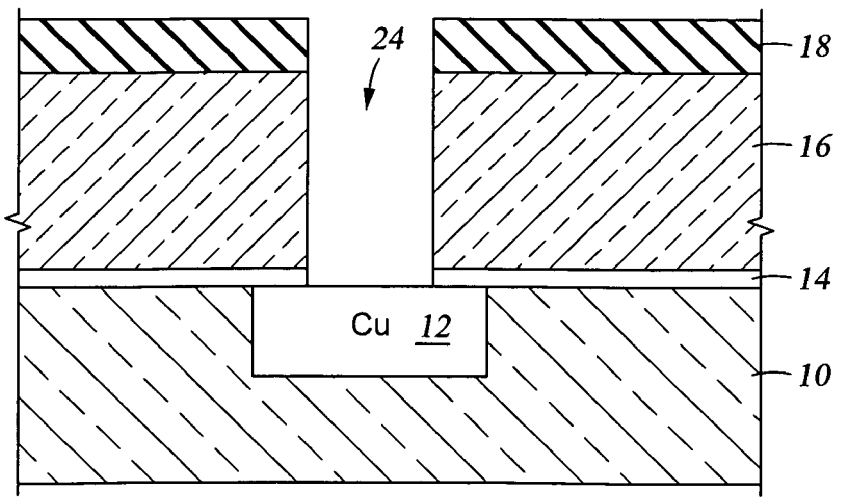
Figure 4:
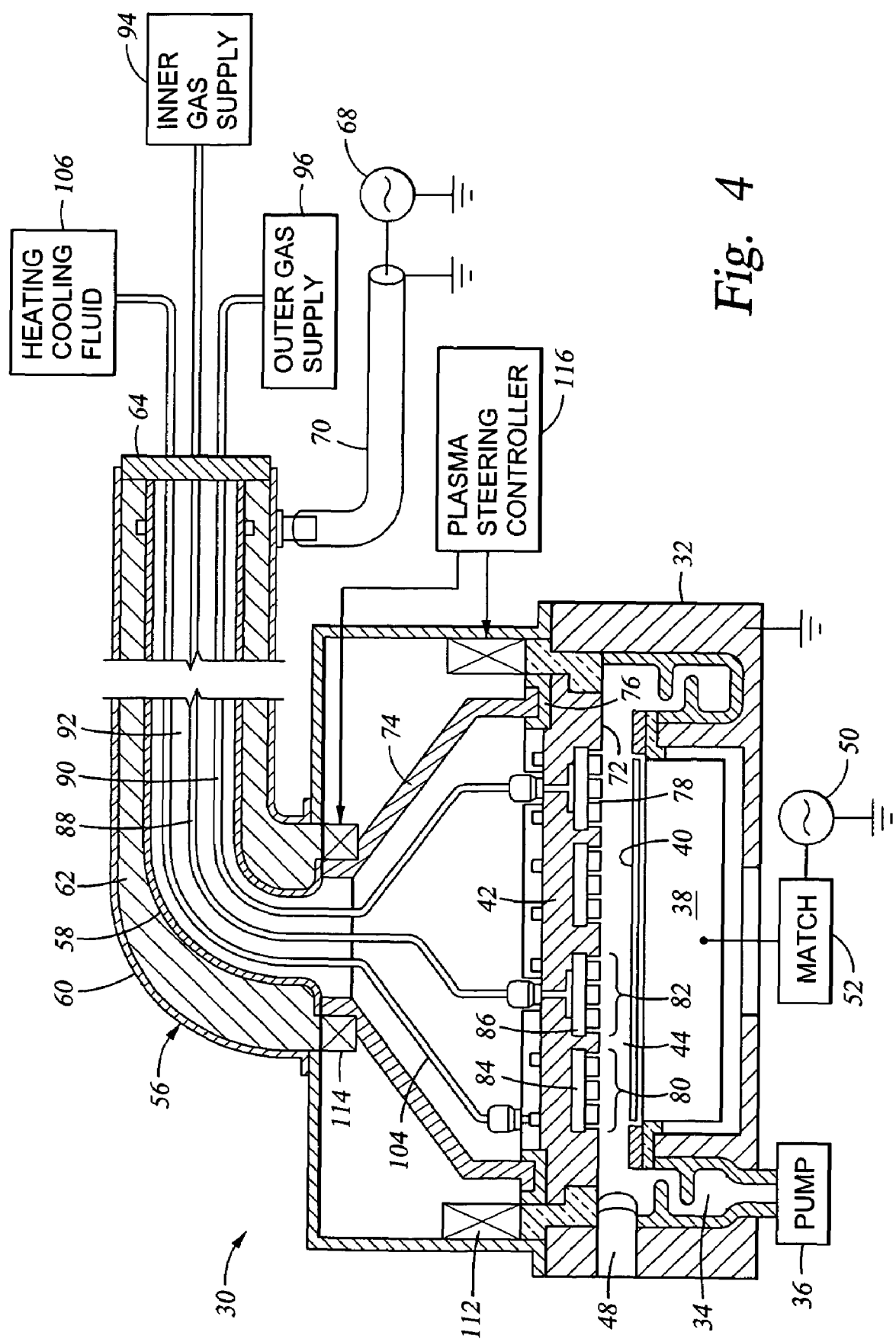
FIG. 4 is a cross-sectional view of a capacitively coupled plasma etch chamber in which the invention may be practiced.
Figure 5:
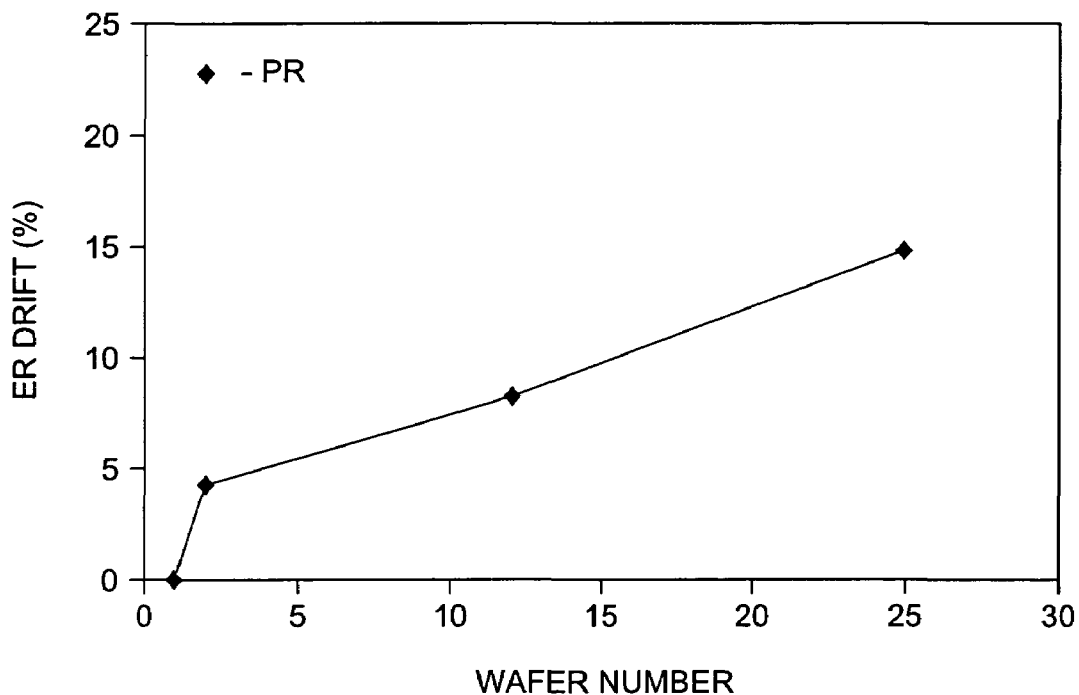
FIG. 5 is a graph illustrating the rapid process drift of etch rate as a function of the number of wafers after chamber cleaning of the prior art.

We have observed that an integrated dielectric etch process for inter-level connect structures performed in a capacitively coupled etch chamber sometimes experiences a problem of chamber contamination caused by sputtering copper in the barrier open step. Opening the barrier necessarily exposes the underlying copper to the barrier etching environment. As always, some amount of over etching of the barrier is required to assure that all the barrier material is removed from over the entire wafer and in spite of any process drift. However, barrier materials are necessarily relatively rugged and difficult to etch. Removal of the barrier layer seems to necessitate reactive ion etching with ion energies of at least 20 eV. Such high ion energies will also sputter copper atoms from the relatively soft underlying copper contact 12 of FIG. 3 exposed at the end of the barrier open. We have observed that copper is coated onto parts of the plasma etch chamber 30 of FIG. 4, for example, the silicon carbide showerhead 42 in opposition to the wafer 40 after just a few etching cycles. Operationally, the etch rate for the photoresist in the bottom layer of the tri-level resist and the photoresist ashing rate is observed to show a drift illustrated in the graph of FIG. 5, which shows that the exemplary photoresist etch rate decreases by about 15% after 25 production wafers. Attempts to optimize the barrier open step and the photomask etching and ashing to minimize the process drift have been only partially successful.

We believe that the process drift arises from copper contamination of the chamber. We confirmed this belief by pasting silicon coupons on the showerhead 42 and measuring by X-ray photoelectron spectroscopy (XPS) copper contamination on the coupons after repeated chamber use and then after chamber cleaning. The tests demonstrated the presence of copper after chamber use and the removal of the copper after the chamber cleaning of the invention.

Much of the experimental data was derived from tests using copper-covered non-production wafers based on other results which show that photoresist etch rates are nearly equally degraded after etching 25 production wafer in the integrated process and after etching for 30 seconds a wafer having a blanket copper surface in a process designed for the photoresist etch. Accordingly, rather than use expensive production wafers for much of the development work, copper-covered test wafers were subjected to conditions intended for dielectric etching of production wafers.

We believe that the copper deposited on chamber parts, especially the showerhead electrode, greatly affect the etching chemistry and needs to be removed. Although manual wet cleaning of the chamber is conventionally performed, the quick onset of degraded etch rate would necessitate manual cleaning on a schedule severely reducing chamber throughput as well as incurring heavy personnel costs. It is possible to use a separate chamber for the barrier open, which itself seems to suffer little from the process drift caused by copper contamination. However, an integrated process is much preferred in which the entire dielectric etch sequence is performed in a single etch reactor.

Figure 1:
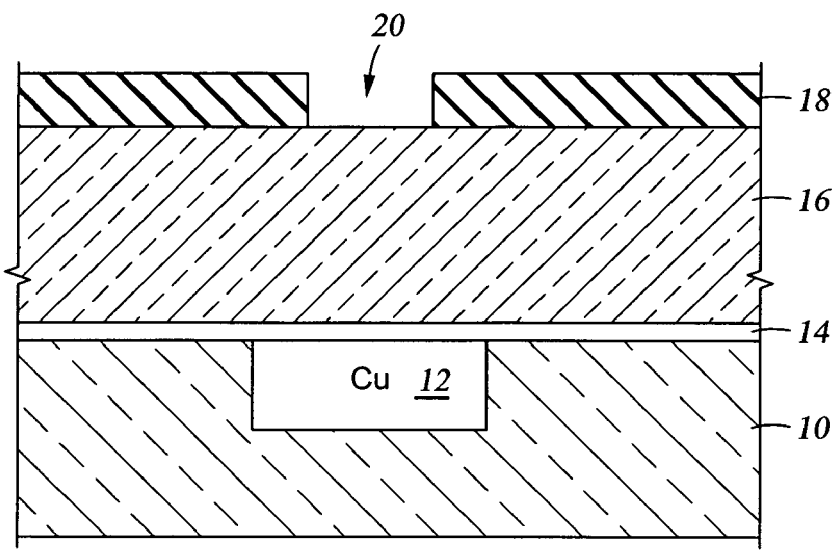
FIGS. 1, 2, and 3 are three cross-sectional views of an inter-level interconnect structure being developed in a dielectric etch process.
Figure 2:
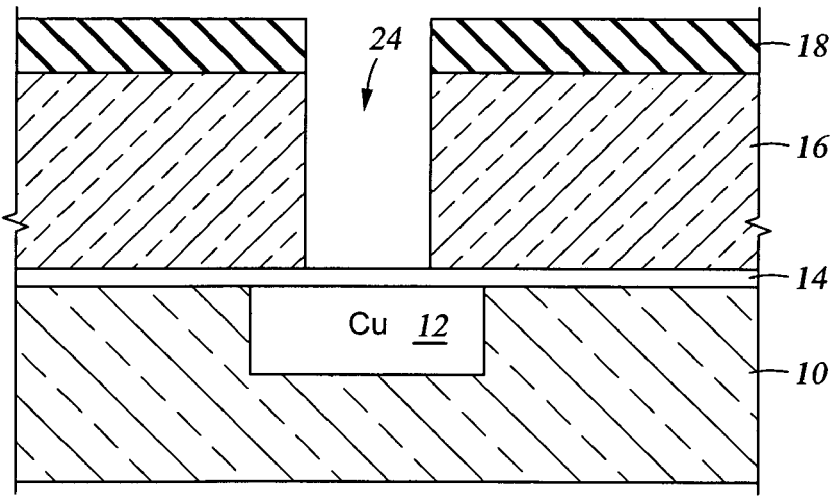
Figure 6:
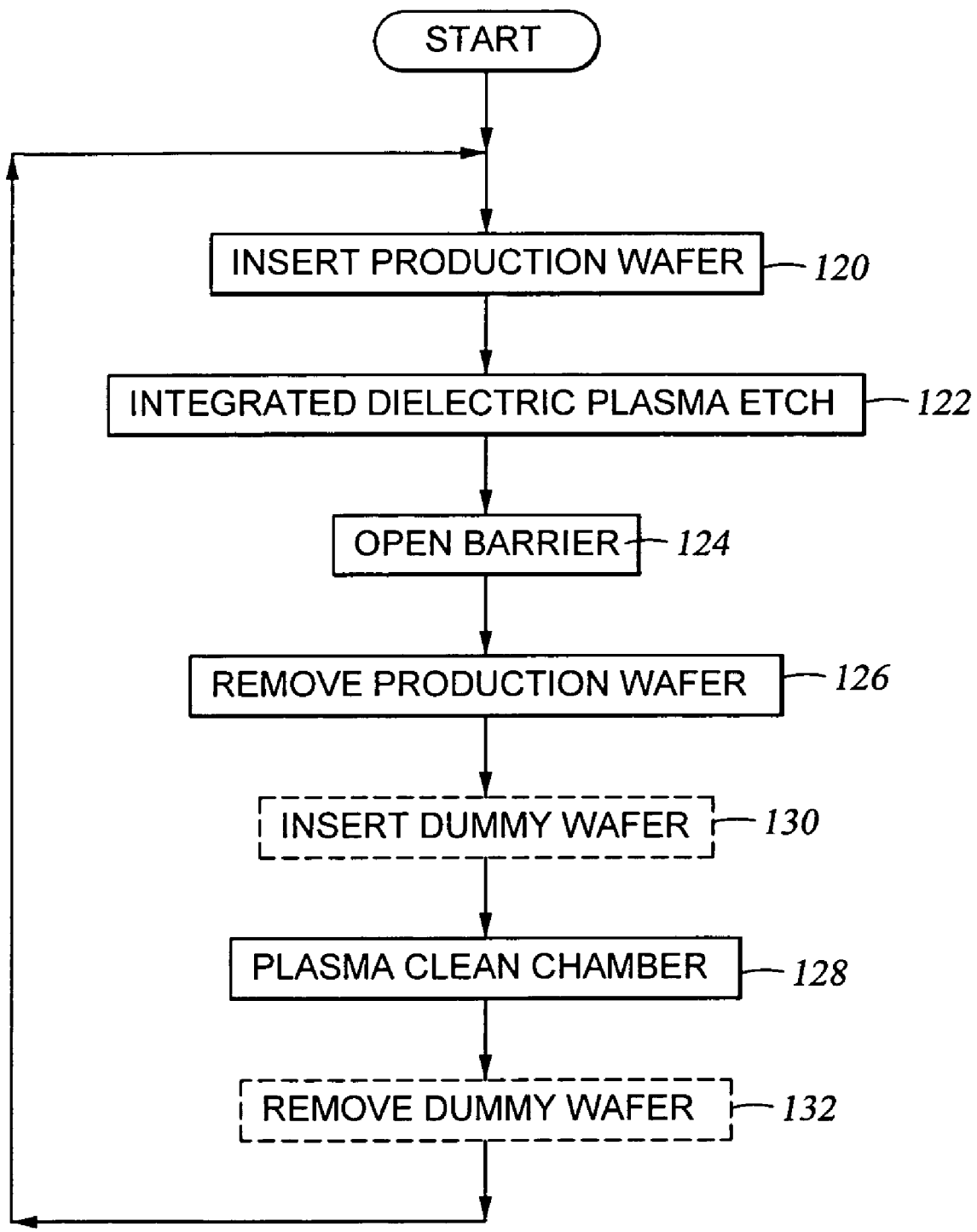
FIG. 6 is a flow diagram of two embodiments of a wafer processing cycle including chamber cleaning of the invention.

According to the invention, the etch chamber is dry cleaned on a frequent basis, for example, once for each wafer cycle. In this embodiment, a wafer cycle is performed according to the process illustrated in the flow chart of FIG. 6. In step 120, a production wafer including a portion with the general structure illustrated in FIG. 1 is inserted from the transfer chamber into the plasma etch chamber and the etch chamber is then isolated from the transfer chamber. In step 122, the integrated dielectric etch process is performed including any final definition of the photomask or hard mask, as well as the main dielectric etch including etching intermediate etch stop layers if required, and finally ashing the remaining photoresist. In step 124, the barrier is opened by removing the barrier layer 14 above the copper contact 12 to achieve the structure illustrated generally in FIG. 3. Although the barrier open step 124 may be considered part of the integrated dielectric etch 122, the barrier open step 124 is believed to produce the copper contamination because the copper contact 12 is exposed to the barrier-open chemistry near the end of the barrier open step 124. In step 126, the production wafer is removed from the plasma etch chamber. In the embodiment of a waferless chamber clean, in step 128 the etch chamber is isolated from the transfer chamber and is dry cleaned in a plasma etching process often involving a significantly different chemistry than those used in the main etch 122 and the barrier open 124. The process then returns to step 120 for the performance of another wafer cycle upon a fresh production wafer.

A waferless chamber clean is preferred because it increases throughput and reduces wafer scheduling complexities. However, the waferless chamber clean exposes the pedestal electrode to the chamber cleaning plasma. Accordingly, in a dummy-wafer cleaning embodiment of the invention, after the etched production wafer has been removed from the chamber in step 126, in step 130, a dummy wafer is inserted into the etch chamber and placed upon the pedestal electrode during the chamber cleaning step 128. A dummy wafer is a non-production wafer which is used repeatedly in the cleaning step 128 to protect the pedestal electrode. After the chamber cleaning, in step 132, the dummy wafer 132 is removed from the cleaned chamber before the process returns to its start for another cycle.

It is of course understood that the chamber cleaning step 128 and the dummy wafer transfer steps 130, 132 if any may be considered to be performed at the beginning of the wafer cycle. Nonetheless, at least in these two embodiments, the chamber cleaning is performed for every wafer cycle to recover the original conditions in the plasma etching chamber.

Etching recipes are summarized in TABLE 1 for three steps of the production etching and for two types of waferless chamber recovery.

TABLE 1

| Parameter | SiC Etch | PR Etch | Ash | $O_2$ Recovery | $H_2/N_2$ Recovery |
|---|---|---|---|---|---|
| $CF_4$ (sccm) | 200 | | | | |
| $CH_4$ (sccm) | | 100 | | | |
| $CH_2F_2$ (sccm) | 5 | | | | |
| $H_2$ (sccm) | | | | | 200 |
| $O_2$ (sccm) | | 50 | 300 | 1500 | |
| $N_2$ (sccm) | | 400 | | | 400 |
| Wafer Bias (W) | 200 | 600 | 300 | | |
| Source Bias (W) | | 1000 | | 2000 | 2000 |
| Pressure (milliTorr) | 60 | 50 | 5 | 30 | 30 |

The values of the parameters are quoted for a 300 mm chamber. The gas flows are given in units of sccm (standard cubic centimeter). The three production etch recipes are exemplary for those used to etch the lower portion of the tri-layer photomask, to etch the silicon carbide (SiC) barrier, and the final ashing step. Silicon carbide may be considered a dielectric in this application because it is etched with etching gases similar to those used for the main dielectric layer. The fluorocarbon etch of the main dielectric layer is not presented here since it seems to be relatively unaffected by the copper contamination and depends upon the details of the dielectric, for example, whether silica or a low-k dielectric. These recipes do not account for the control of radial uniformity provided by the differential gas feed and the magnetic coils around the top of the chamber, features needing optimization but not crucial to the present invention.

The table summarizes two types of chamber recovery, oxidizing and reducing. In both types of waferless recovery the VHF source applied a high plasma source power to generate an intense plasma in the area adjacent the showerhead and distant from the wafer pedestal. However, no biasing power is applied to the unprotected pedestal. Added pedestal biasing would accelerate plasma ions to the pedestal and tend to sputter etch it. Instead, the plasma etching is concentrated on the showerhead and other chamber parts.

The oxidizing recovery uses only oxygen gas ($O_2$) as an etch gas. Other oxidizing gases could be substituted, for example, ozone ($O_3$). Although the oxygen cleaning was productive, its results were less favorable than for the reducing clean.

The reducing chemistry uses a combination of hydrogen and nitrogen as the reducing etch gases. Recovery tests were performed using only hydrogen and using only nitrogen. Hydrogen alone was somewhat effective; nitrogen alone was productive but less so than hydrogen alone. The best observed results were obtained with the combination of hydrogen and nitrogen. The chamber recovery of the invention may use other reducing gases, for example, ammonia ($NH_3$), which contains both hydrogen and nitrogen.

The reducing chamber recovery provides better results than the oxidizing chamber recovery in recovering the dielectric etch rates. However, a sequence of oxidizing and reducing chamber recovery, for example, an oxidizing chamber clean followed by a reducing chamber clean, seems to provide even better results and can result in dielectric etch rates above the initial values.

Copper and metal contamination during a dielectric etch presents unique problems. Metallic layers such as copper and other metals and their alloys tend to form looser atomic bonds than dielectrics or silicon so that they are more easily sputtered by energetic dielectric etching ions. Metal compounds, especially oxides, are usually not volatile so that sputtered metals, even if originating from metal nitride dielectrics such as TaN, are more likely to settle on chamber parts than be exhausted from the system.

We believe that the reducing chemistry more effectively cleans copper contamination form the chamber. Copper and other metals undergoing a fluorocarbon etch tend to form metal fluoride residues on the chamber parts such as $CuF_x$. Aluminum fluoride is particularly difficult to remove. Metal fluorides can be reduced in a reducing clean.

Figure 7:
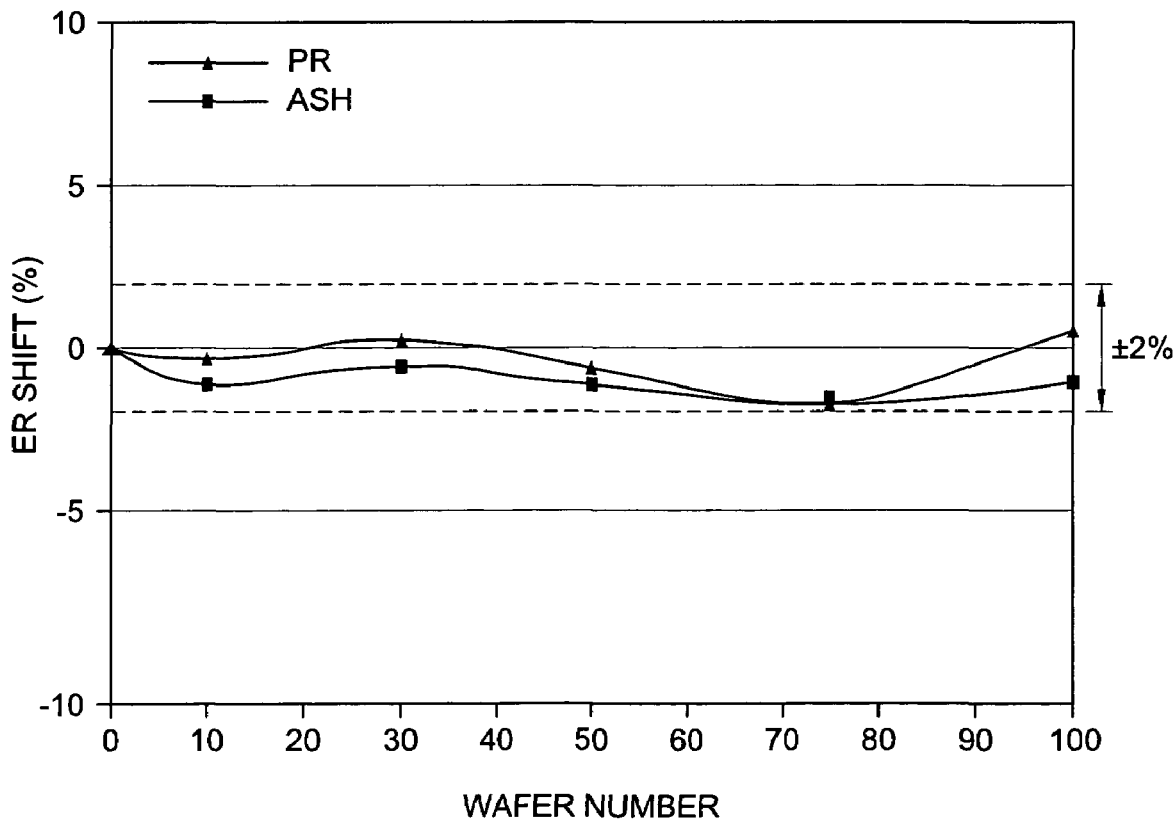
FIG. 7 is a graph illustrating the small process drift of etch rate as a function of the number of wafer cycles utilizing chamber cleaning of the invention.

A long-term test was performed by applying the SiC barrier open etch to a silicon wafer pasted with five 2 cm×2 cm copper tape for a 2.8% copper exposure. After each barrier open step, a waferless recovery was performed applying the above reducing recovery for 20 s followed an oxidizing plasma clean for 30 s including 1900 sccm of $O_2$ and 2000 W of source power at a chamber pressure of 500 milliTorr. Periodically, the photoresist and ashing rates were measured on other test wafers covered with photoresist. The results over 100 wafer cycles are presented in the graph of FIG. 7. The etch rates for both photoresist etch, represented by triangles, and for ashing, represented by squares, varied less than ±2% from their initial values, which is less than the measurement error. Thus, waferless recovery virtually eliminates the drift attributable to copper contamination.

A recovery using a dummy wafer of blank silicon has the advantage of protecting the sensitive parts of the pedestal including electrostatic chuck and thermal gas channels during the recovery. Three dummy-wafer recovery recipes were developed. The separate recipes are summarized in TABLE 2.

TABLE 2

| Parameter | F/C Recovery | $O_2$ Recovery | $H_2/N_2$ Recovery |
|---|---|---|---|
| $CF_4$ (sccm) | 60 | | |
| $CHF_3$ (sccm) | 120 | | |
| $H_2$ (sccm) | | | 200 |
| $O_2$ (sccm) | | 500 | |
| $N_2$ (sccm) | | | 400 |
| Ar (sccm) | 100 | | |
| Wafer Bias (W) | 2000 | 200 | 600 |
| Source Bias (W) | | 2000 | 1000 |
| Pressure (milliTorr) | 50 | 10 | 50 |

Since the pedestal is protected during the recovery step, significant wafer bias may be applied to the pedestal to thus increase the density of the plasma. The fluorocarbon (F/C) recovery shows positive effects but significantly less than the oxidizing or reducing recovery. Again, the reducing recovery, especially with the combination of hydrogen and nitrogen, is more effective than the oxidizing recovery in restoring the production etch rates.

Although the insertion of dummy wafers during chamber cleaning allows more aggressive etching to effect the cleaning, the dummy wafer presents a handling and scheduling problem which reduces the system throughput. Throughput with a dummy-wafer recovery would be increased if the recovery could be postponed till after a significant number of production wafers were etched, for example, the approximately 25 wafers contained in a cassette. That is, if the sensitivity of the dielectric etch steps to copper contamination can be reduced by optimizing the dielectric etch conditions, recovery need not be performed for every wafer cycle. Then, a small number, preferably one, of dummy wafers may be loaded into the cassette and transferred into the etch chamber in turn when the chamber is cleaned once or only a few times per cassette rather than for every production wafer.

In some circumstance, it is possible to perform the chamber cleaning with the production wafer supported on the pedestal.

Although the chamber recovery of the invention has been described for structures including a copper layer underlying a dielectric layer such as a barrier layer, it may be applied to other structures with different underlying metal layers, such as aluminum metallization comprising no more than 10 at % of non-aluminum elements. Similarly, the barrier layer may be materials other than silicon carbide, such as silicon nitride ($Si_3N_4$), silicon oxynitride, or BLoK dielectric, which is a barrier material developed by Applied Materials and comprising silicon nitride and carbon. Although the invention has been described for the VHF-powered diode chamber of FIG. 4, it may be practiced in more conventional RF-power plasma etch chambers and in plasma etch chambers utilizing inductively coupled RF power. Further, the cleaning gas may be excited into a plasma in a remote plasma source.

The invention thus substantially reduces process drift in the dielectric etching of advanced integrated circuits, particularly those utilizing copper metallization.

The invention claimed is:

1. A process for etching and chamber cleaning, comprising:
   (a) inserting into a plasma etch chamber a production substrate from a cassette having one or more production substrates and the production substrate comprises a dielectric layer overlying a metal layer;
   (b) plasma etching the dielectric layer to expose the metal layer;
   (c) removing the production substrate from the chamber;
   (d) cleaning the chamber with a plasma of a reducing cleaning gas consisting essentially of a mixture of nitrogen gas and hydrogen gas;
   (e) then cleaning the chamber with a plasma of a gas consisting essentially of oxygen; and
   (f) returning to (a) such that the chamber is cleaned one or more times per cassette.

2. The process of claim 1, wherein a bottom portion of the dielectric layer comprises silicon carbide.

3. The process of claim 1, wherein the metal layer comprises copper.

4. The process of claim 1, wherein the metal layer comprises aluminum.

5. The process of claim 1, wherein (f), returning to (a), comprises that the chamber is cleaned for every production substrate.

6. The process of claim 1, wherein a pedestal supports the production substrate during the etching step and wherein the pedestal is uncovered during at least one of the cleaning steps.

7. The process of claim 1, wherein a pedestal supports the production substrate during the etch step and further including placing a non-production substrate on the pedestal during at least one of the cleaning steps.

8. The process of claim 1, wherein the metal layer underlies portions of the dielectric layer removed by the plasma step (b) and wherein in step (c) the production substrate is removed from the chamber before the metal layer is etched through.

9. A process for plasma etching and chamber cleaning, comprising:
   inserting into a plasma etching chamber a production substrate comprising a dielectric layer over a copper layer into a plasma etch chamber;
   etching the dielectric layer to expose the copper layer;
   removing the production substrate from the chamber; and
   with no production substrate being present in the chamber, cleaning the chamber with a plasma of a reducing cleaning gas consisting essentially of hydrogen gas and nitrogen gas, and then cleaning the chamber with a plasma of a gas consisting essentially of oxygen.

10. The process of claim 9, wherein a bottom portion of the dielectric layer comprises silicon carbide.

11. The process of claim 9, wherein a pedestal supporting the production substrate during the etching step is vacant during at least one of the cleaning steps.

12. The process of claim 11, wherein the pedestal is not electrically biased during at least one of the cleaning steps.

13. The process of claim 9, where a pedestal supporting the production substrate during the etch step supports a non-production substrate during at least one of the cleaning steps.

14. The process of claim 13, wherein the pedestal is electrically biased during at least one of the cleaning steps.

15. The process of claim 13, wherein a cassette coupled to the chamber contains a first plurality of the production substrates and the inserting, plasma etching and removing steps are sequentially performed for each of the first plurality of the production substrates so that there are a first plurality of etching steps and the cleaning step is performed only once for the first plurality of etching steps.

16. The process of claim 9, wherein the inserting, plasma etching, removing and cleaning steps are sequentially performed for each of a plurality of production wafers so that there are a plurality of etching steps and the chamber cleaning is performed only once for each of the plurality of etching steps.

17. A process for etching and chamber cleaning, comprising the steps of:
   (a) inserting into a plasma etch chamber a production substrate from a cassette having one or more production substrates and the production substrate comprises a dielectric layer overlying a metal layer;
   (b) plasma etching the dielectric layer to expose the metal layer;
   (c) while the production wafer is in the chamber, cleaning the chamber with a plasma of a reducing gas consisting essentially of hydrogen gas and nitrogen gas, and then cleaning the chamber with a plasma of a gas consisting essentially of oxygen; and
   (d) returning to (a) such that the chamber is cleaned for every production wafer.

18. The process of claim 17, wherein the metal layer principally comprises copper.

19. The method of claim 17, wherein the (d) returning to (a) comprises that the chamber is cleaned for every production substrate.

* * * * *